April 7, 1964

E. WALDKÖTTER ETAL

SEMICONDUCTOR DEVICE WITH A THERMAL STRESS EQUALIZING PLATE

Filed June 21, 1961

3,128,419

United States Patent Office 3,128,419
Patented Apr. 7, 1964

3,128,419
SEMICONDUCTOR DEVICE WITH A THERMAL STRESS EQUALIZING PLATE

Erich Waldkötter, Berlin-Spandau, and Hans Schering, Berlin-Haselhorst, Germany, assignors to Siemens-Schuckertwerke Aktiengesellschaft, Berlin-Siemensstadt, Germany, a corporation of Germany Filed June 21, 1961, Ser. No. 119,014
Claims priority, application Germany June 23, 1960
9 Claims. (Cl. 317—234)

Figure 1:
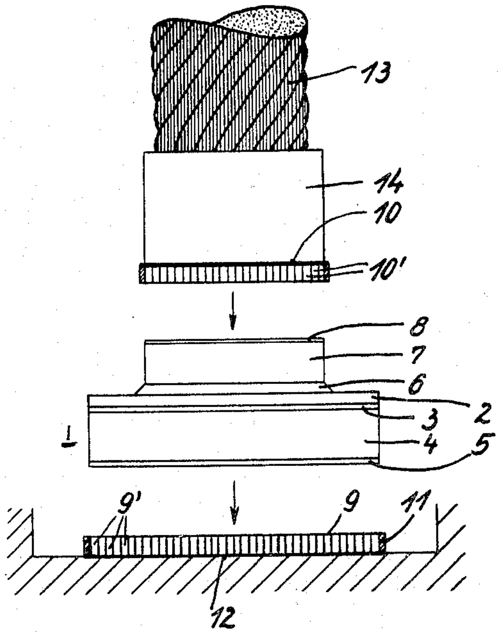

Our invention relates to electronic semiconductor devices, such as rectifiers or transistors, with p-n junctions in monocrystalline semiconductor bodies, for example of germanium or silicon.

Such devices are sensitive to soiling and for that reason must be encapsuled in a housing evacuated or filled with protective gas. In most conventional devices of this type, the semiconductor element proper, inclusive of its electrodes, is area-bonded by soft soldering with a wall of the housing, usually its bottom. Since the housing must dissipate the waste heat of the semiconductor element, it is preferably made of copper and is given great wall thickness. However, the electrode plate of the semiconductor element, soldered to the copper, usually consists of a material of a much lower thermal coefficient of expansion than copper, for example of molybdenum or tungsten. As a result, the layer of soft solder is subjected to considerable thermal stresses under the effect of changes in temperature. It has been proposed to reduce these stresses by insertion of intermediate bodies which at least partially bridge or compensate the difference between the thermal coefficients of expansion. By thus reducing the tension in the soft-solder layer, its permanent strength and hence the useful lifetime of the entire semiconductor device can be increased considerably. This is particularly significant for semiconductor devices whose normal operation requires them to be frequently switched on and off, for example, when the semiconductor devices are used on vehicles for propulsion control or as rectifiers in welding systems.

It is an object of our invention to devise particularly simple and improved means of minimizing or virtually eliminating thermally caused stresses of the above-mentioned kind.

To this end, according to a feature of our invention, we provide a semiconductor device, in which the electrode of a semiconductor element is area-bonded with a metallic structure of different thermal expansion than the electrode with a flat equalizing plate soldered between the electrode and the adjacent structure and composed of a mosaic assembly of many individual metallic bodies that are joined with each other but are capable of being displaced relative to each other. Due to the separation into a multiplicity of individual elements, the equalizing plate can follow any thermal expansion of the electrode or of the metallic structure, particularly the housing bottom, with which the electrode is joined by soldering. If the two mutually adjacent and face-to-face bonded areas expand in respectively different degrees, only relatively slight shearing forces occur in the individual elements of which the equalizing intermediate plate is composed. Consequently, the intermediate plate constitutes a quasi-plastic medium which prevents the occurrence of thermal tension at its boundary surfaces to such a great extent as to prevent the occurrence of damaging stresses.

The individual bodies of the equalizing plate preferably consist of copper which is well solderable and has a high thermal conductance. It is preferable to employ copper of best obtainable purity and consequently high-ductility whereby the mechanical tensions transmitted by the equalizing plate are further minimized. According to another preferred feature of our invention the equalizing plate is composed of copper pins whose length extends perpendicular to the plane of the plate and has a ratio with respect to the plate diameter of at least approximately 2:1. Particularly advantageous is a ratio of pin length to overall pin-bunch diameter of approximately 20:1.

Figure 2:
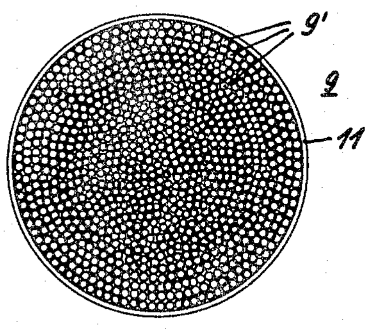

The invention will be further described with reference to the embodiment of an electronic semiconductor device illustrated by way of example on the accompanying drawing in which FIG. 1 shows a lateral view of the device in exploded fashion, and FIG. 2 is a top view onto the appertaining equalizing plate.

The device shown in FIG. 1 is a silicon p-n rectifier generally of conventional design, except that the thickness of the individual layers is shown exaggerated for the purpose of illustration. The rectifier comprises a monocrystalline circular wafer 2 of silicon. The wafer is doped in known manner so as to comprise a rectifying p-n junction. Located at the bottom side of the silicon wafer 2 is a thin aluminum layer 3 and a relatively thick molybdenum plate 4 which for improved solderability is coated with an iron-nickel alloy 5. Located on top of the silicon wafer 2 is a gold layer 6, and a molybdenum plate 7 which is likewise plated with a coating 8 of iron-nickel alloy. The relatively thick molybdenum plates 4 and 7 have approximately the same thermal coefficient of expansion ($a=5.1 \cdot 10^{-6}$ per ° C.) as the silicon wafer 2 ($a \approx 5 \cdot 10^{-6}$ per ° C.). The entire element 1 behaves substantially as a uniform body in the event of temperature changes, because the thin intermediate layers 3 and 6 of aluminum or gold which have foil thickness and are alloyed together with the silicon do not produce appreciable mechanical tension. The electrode plates 4 and 7 may also consist of tungsten ($a=4.5 \cdot 10^{-6}$ per ° C.).

Denoted by 12 is the bottom of a housing or capsule which perimetrically encloses and seals the rectifier element proper and is designed as a thick-walled cup of copper ($a=16.5 \cdot 10^{-6}$ per ° C.). When assembling the device, the rectifier element 1 is to be soldered onto the housing bottom 12. Furthermore, the upper electrode plate 7/8 of the element is to be joined by soldering with the copper shoe 14 of a flexible current supply cable 13. Since the semiconductor element 1 cannot withstand very high temperatures, the soldering is preferably effected by means of soft solder such as tin solder, so that the soldering operation can be performed at temperatures in the neighborhood of 200° C.

According to the invention, the semiconductor element 1 is not directly soldered to the bottom 12 of the housing, but an equalizing plate 9 is interposed. The plate 9, shown separately in FIG. 2 by a top view, is composed of a multiplicity of cylindrical copper-wire pieces 9' which are held together by a ring 11. For preparing the soldering operation, the end faces of the copper pins 9' are coated with tin on both sides. Thereafter the entire equalizing plate 9 is soft-soldered between the parts 5 and 12. In order to prevent the solder from running between the copper pins 9', the peripheral surfaces of the individual wire pins 9 are coated with a non-solderable coating, for example, oxidized.

When soldering the plate 9 between the parts 5 and 12, all parts are at the soldering temperature of approximately 200° C. There are no thermal tensions at this stage. After cooling, the housing bottom 12 of copper, having a higher coefficient of expansion, has more strongly contracted than the molybdenum plate 4. Consequently, the copper pins 9' slightly divert upwardly in cooled condition. During the reheating, this divergence becomes again reduced with the result that the direction of the copper pins varies slightly, so that the equalizing plate 9 can follow the expansion of the adjacent structural parts during temperature changes in subsequent operation without occurrence of internal tension.

When soldering the plate 9, it is preferable to prevent soldering of the ring 11 to the bottom 12 or the plate 5. For that reason, the ring 11 is preferably made of a material, for example aluminum, that is not readily bonded to solder. It is particularly of advantage to make the ring 11 of a metal that possesses a thermal coefficient of expansion not appreciably greater than that of the adjacent electrode plate 4. If, as described above, the electrode plate 4 consists of molybdenum having a thermal coefficient of expansion of $5.1 \cdot 10^{-6}$ per ° C., then the coefficient of expansion of the material used for the ring 11 should be lower, or should not be substantially greater, than this value. For that reason it is preferable to use for the ring 11 an iron-nickel alloy which, by corresponding choice of its composition, can be given a suitable coefficient of expansion, for example of $5 \cdot 10^{-6}$ ° C. Such a ring shrinks or expands with changes in temperature of the device to the same extent as the molybdenum plate 4. The ring therefore cannot exert any detrimental forces upon the copper pins 9' which are soldered to the molybdenum plate 4. The iron-nickel ring 11, prior to soldering of the plate 9 into the device is preferable oxidized or provided with another coating which does not retain solder.

The shoe 14 can be provided in the same manner with another equalizing plate 10 which, like the plate 9, is composed of short copper wire pieces 10'. The equalizing plate 10, too, is joined, preferably by soft-soldering, with the copper shoe 14 on the one hand, and with the iron-nickel plating 8 of the molybdenum plate 7 on the other hand.

There are different ways of producing equalizing plates for the purpose of our invention. One way is to use a bunch of copper wires having an individual diameter of less than 1 mm., preferably of about 0.1 to 0.5 mm., (the latter being a ratio of 4:1 of length to diameter), and first coating the individual wires with oxide or sulphide by heating them in air or hydric sulphide ($H_2S$). The bunch of copper wires, thus coated, is then pushed into a pipe with as tight a fit as possible. The pipe may consist of aluminum for example. Thereafter the diameter of the pipe is reduced by pressing or rolling on a lathe so that the wires are tightly forced together. The resulting pipe-enclosed strand, having an ultimate overall bunch diameter of 20 mm. for example (corresponding to a ratio of approximately 20:1 of overall bunch diameter to individual wire diameter), is then cut by sawing into discs of the desired thickness, for example 2 mm. Due to the pressing or rolling operation on the lathe or a corresponding device, the short copper wire pieces can be made to hold so tightly together that the sawed-off discs can be manipulated without any particular cautionary expedients.

Another way of producing the equalizing discs is to first push the bunch of wires into a pipe and then fill the interstice of the wire bunch in the interior of the pipe by casting a synthetic resin into the interstitial spaces. After hardening of the resin, discs of the desired thickness are sawed off the filled pipe. The casting resin to be used for this purpose must be sufficiently stable at the temperature of approximately 200° C. occurring during soft soldering. Resinous synthetics satisfying this requirement are, for example, the commercially available epoxyd or silicone resins. Brittle resins, for example epoxyd resins, will crack during cooling of the equalizing plate after soldering, so that the individual metallic elements of the plate can freely move relative to each other. Elastic or rubberlike soft resins which, due to these properties, do not crack, produce for the same reasons only slight counterforces in the event of an internal deformation of the equalizing plate so that in this case, too, a sufficient mobility of the metallic individual elements of the plate is secured.

With the above-mentioned methods, a copper filling factor in the equalizing plate of about 70 to about 80% can be obtained. For that reason, some reduction in heat conducting cross section is encountered when using such an equalizing plate, in comparison with the direct soldering of the semiconductor element to the housing bottom. However, this reduction in heat conductance causes no more than a few degrees centigrade increase in temperature within the semiconductor crystal during operation of the semiconductor device.

While the invention has been described with reference to a silicone rectifier device, it is analogously applicable with semiconductor devices of other types, for example power transistors, Dynistors (hyperconductive diodes) and Trinistors (silicon-controlled rectifiers and other four-layer semiconductor devices). The invention is further applicable to semiconductor devices whose semiconductor proper consists of germanium or other semiconductor substances. Such and other modifications will be obvious to those skilled in the art upon a study of this disclosure and are indicative of the fact that our invention can be given embodiments other than particularly illustrated and described herein, without departing from the essential features of our invention and within the scope of the claims annexed hereto.

We claim:

1. An electronic semiconductor device comprising a semiconductor body having an electrode, and a metallic structure joined with said electrode in face-to-face relation thereto and having a thermal coefficient of expansion different from that of said electrode, in combination with an equalizing plate disposed between said electrode and said structure and being joined with both in area contact therewith, said equalizing plate comprising a multiplicity of individual metallic pins of highly heat-conductive and highly current-conductive material positioned with their longitudinal axes perpendicular to the plane of said plate, said pins arranged and being displaceable relative to one another within said plate for minimizing mechanical tension otherwise due to said different coefficients when said device is subjected to temperature variation, and soldered joints connecting the respective ends of said pins on one side of said plate to said electrode and on the other side of said plate to said metallic structure.

2. An electronic semiconductor device comprising a semiconductor body having an electrode of metal selected from the group consisting of molybdenum and tungsten, and a copper structure joined with said electrode in face-to-face relation thereto, in combination with an equalizing plate disposed between said electrode and said structure and being joined with both in area contact therewith, said equalizing plate comprising a multiplicity of individual copper pins of highly heat-conductive material positioned with their longitudinal axes perpendicular to the plane of said plate, said pins forming together a mosaic arrangement and being displaceable relative to one another within said plate for minimizing mechanical tension due to the difference in the thermal coefficients of expansion of said electrode and said structure respectively, and soldered joints connecting the respective ends of said pins on one side of said plate to said electrode and on the other side of said plate to said metallic structure.

3. In a semiconductor device according to claim 2, said individual copper pins extending parallel to the thickness of said plate and having individually a length-to-diameter ratio of at least 4 to 1.

4. In a semiconductor device according to claim 2, said individual copper pins extending as a bunch parallel to the thickness of said plate and having an ultimate overall bunch diameter to individual pin diameter corresponding to a ratio of approximately 20 to 1.

5. In a semiconductor device according to claim 2, said individual copper pins extending parallel to the thickness of said plate, and said plate having a peripheral metal ring tightly surrounding said pins.

6. In a semiconductor device according to claim 2, said individual copper pins extending parallel to the thickness of said plate, and said plate having a peripheral metal ring tightly surrounding said pins, said soldered joints comprising soft-solder bonds area-bonding said plate with said electrode and with said structure respectively.

7. In a semiconductor device according to claim 6, said copper pins being individually coated with a non-solderable substance.

8. An electronic semiconductor device comprising a monocrystalline semiconductor body having a p-n junction and having an electrode area bonded to said body, a housing of copper having a cup-shaped space on whose bottom said semiconductor body is located, an equalizing plate soldered in face-to-face relation to said bottom and to said electrode, said plate comprising a multiplicity of individual metal pins of highly heat-conductive material positioned with their longitudinal axes perpendicular to the plane of said plate, said pins forming together a mosaic arrangement and being displaceable relative to one another within said plate for minimizing mechanical tension due to the difference in the thermal coefficients of expansion of said electrode and said housing respectively, and soldered joints connecting the respective ends of said pins on one side of said plate to said electrode and on the other side of said plate to said metallic structure.

9. An electronic semiconductor device comprising a monocrystalline semiconductor body having a p-n junction and having an electrode area bonded to said body, a flexible cable having a terminal member, an equalizing plate soldered in face-to-face relation to said terminal member and to said electrode, said plate comprising a multiplicity of individual metal pins of highly heat-conductive material positioned with their longitudinal axes perpendicular to the plane of said plate, said pins forming together a mosaic arrangement and being displaceable relative to one another within said plate for minimizing mechanical tension due to the difference in the thermal coefficients of expansion of said electrode and said terminal member respectively, and soldered joints connecting the respective ends of said pins on one side of said plate to said electrode and on the other side of said plate to said metallic structure.

References Cited in the file of this patent

UNITED STATES PATENTS

| | | |
|---|---|---|
| 2,311,704 | Simison | Feb. 23, 1943 |
| 2,607,109 | Reynolds | Aug. 19, 1952 |
| 2,945,992 | Bollert et al. | July 19, 1960 |
| 2,998,554 | Koets et al. | Aug. 28, 1961 |

FOREIGN PATENTS

| | | |
|---|---|---|
| 1,057,241 | Germany | May 14, 1959 |